United States Patent
Liu et al.

(10) Patent No.: US 11,417,826 B2
(45) Date of Patent: Aug. 16, 2022

(54) ULTRASONIC SENSOR, MANUFACTURING METHOD THEREOF AND DISPLAY DEVICE

(71) Applicant: BOE TECHNOLOGY GROUP CO., LTD., Beijing (CN)

(72) Inventors: Libin Liu, Beijing (CN); Qian Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 365 days.

(21) Appl. No.: 16/609,296

(22) PCT Filed: May 17, 2019

(86) PCT No.: PCT/CN2019/087453
§ 371 (c)(1),
(2) Date: Oct. 29, 2019

(87) PCT Pub. No.: WO2019/228198
PCT Pub. Date: Dec. 5, 2019

(65) Prior Publication Data
US 2021/0367136 A1    Nov. 25, 2021

(30) Foreign Application Priority Data
May 30, 2018 (CN) .......................... 201810541399.2

(51) Int. Cl.
*G09G 5/00* (2006.01)
*H01L 41/113* (2006.01)
(Continued)

(52) U.S. Cl.
CPC ...... *H01L 41/1132* (2013.01); *H01L 41/0472* (2013.01); *H01L 41/0477* (2013.01); *G06F 3/0412* (2013.01); *G06V 40/1306* (2022.01)

(58) Field of Classification Search
CPC ............. H01L 41/1132; H01L 41/0472; H01L 41/0477; G06F 3/0412; G06F 3/041; G06F 3/045; G09G 5/00
See application file for complete search history.

(56) References Cited

U.S. PATENT DOCUMENTS 9,525,119 B2 * 12/2016 Latev ................... B06B 1/0622
9,660,170 B2 *  5/2017 Hajati .................. H01L 41/331
(Continued)

FOREIGN PATENT DOCUMENTS

CN       102884814 A    1/2013
CN       104876176 A    9/2015
(Continued)

OTHER PUBLICATIONS

First Office Action issued by the Chinese Patent Office in the priority Chinese application No. 201810541399.2 dated Jun. 27, 2019 and its English translation.

*Primary Examiner* — Pegeman Karimi
(74) *Attorney, Agent, or Firm* — Dilworth & Barrese, LLP.; Michael J. Musella, Esq.

(57) ABSTRACT

The embodiments of the present disclosure disclose an ultrasonic sensor, a manufacturing method thereof, and a display device. The ultrasonic sensor includes a substrate and at least one sensor component located on the substrate. The sensor component includes a first electrode, a second electrode, and a piezoelectric layer located between the first electrode and the second electrode. The substrate is provided with a groove on a side close to the sensor component, and the orthographic projection of the piezoelectric layer on the substrate has a portion overlapping with a region of the groove in the substrate.

16 Claims, 5 Drawing Sheets

(51) Int. Cl.
   *H01L 41/047* (2006.01)
   *G06F 3/041* (2006.01)
   *G06V 40/13* (2022.01)

(56) References Cited

U.S. PATENT DOCUMENTS

| | | | |
|---|---|---|---|
| 2012/0206014 A1* | 8/2012 | Bibi | B06B 1/0207 310/331 |
| 2013/0016587 A1 | 1/2013 | Lee | |
| 2017/0062694 A1 | 3/2017 | Latev et al. | |
| 2017/0364726 A1 | 12/2017 | Buchan et al. | |
| 2019/0302948 A1* | 10/2019 | Laitinen | H01L 41/053 |
| 2020/0401777 A1* | 12/2020 | Won | G06K 9/0002 |

FOREIGN PATENT DOCUMENTS

| | | |
|---|---|---|
| CN | 106250834 A | 12/2016 |
| CN | 205983304 U | 2/2017 |
| CN | 106711320 A | 5/2017 |
| CN | 107145858 A | 9/2017 |
| CN | 206546583 U | 10/2017 |
| CN | 206991333 U | 2/2018 |
| CN | 108955736 A | 12/2018 |

\* cited by examiner

ULTRASONIC SENSOR, MANUFACTURING METHOD THEREOF AND DISPLAY DEVICE

The present application claims priority to Chinese Patent Application No. 201810541399.2, filed on May 30, 2018, the entire disclosure of which is hereby incorporated by reference as a part of the present application.

TECHNICAL FIELD

Embodiments of the present disclosure relate to an ultrasonic sensor and a manufacturing method thereof, and a display device.

BACKGROUND

Ultrasonic sensor is a sensor developed by using the characteristics of ultrasonic wave. It is a reversible sensor. It can generate mechanical vibration of the same frequency under the excitation of alternating current signal in order to serve as an ultrasonic transmitter. It can also generate electrical signals of a corresponding frequency under ultrasonic vibration of a certain frequency to serve as a receiver for the ultrasonic wave.

SUMMARY

At least one embodiment of the present disclosure provides an ultrasonic sensor and a display device. The ultrasonic sensor includes a substrate and at least one sensor component located on the substrate. The sensor component includes: a first electrode, a second electrode, and a piezoelectric layer located between the first electrode and the second electrode. A side of the substrate close to the sensor component is provided with a groove, and an orthographic projection of the piezoelectric layer on the substrate has a portion overlapping with a region of the groove in the substrate.

For example, the first electrode is located on a side of the piezoelectric layer close to the substrate, and in a first direction parallel to the substrate, the orthographic projection of the first electrode on the substrate includes a first portion located within the groove and a second portion located on both sides of the groove.

For example, the first electrode exposes a portion of the groove.

For example, a dimension of the first electrode in a second direction is smaller than a dimension of the groove in the second direction, the second direction is parallel to the substrate, and the second direction is perpendicular to the first direction.

For example, the orthographic projection of the piezoelectric layer on the substrate coincides with the orthographic projection of the first electrode on the substrate.

For example, the orthographic projection of the piezoelectric layer on the substrate is entirely located within the region of the groove on the substrate.

For example, the number of the sensor components is multiple, and the sensor components share the first electrode, and/or share the second electrode. The ultrasonic sensor further includes a planarization layer located on a side of the piezoelectric layer away from the substrate. The planarization layer includes a via hole exposing the piezoelectric layer, and the second electrode is connected to the piezoelectric layer through the via hole.

For example, a depth of the groove in a direction perpendicular to the substrate is in a range of 3 to 10 μm.

For example, the dimension of the groove in the first direction is in a range of 20 to 50 μm, and the dimension of the groove in the second direction is in a range of 20 to 50 μm.

At least one embodiment of the present disclosure provides a manufacturing method of an ultrasonic sensor, including: providing a substrate; forming a groove in the substrate; and forming a sensor component on a side of the substrate where the groove is formed. A step of forming the sensor component includes: sequentially forming a first electrode, a piezoelectric layer, and a second electrode on the substrate in a stacked manner, and an orthographic projection of the piezoelectric layer on the substrate has a portion overlapping with a region of the groove in the substrate.

For example, before forming the piezoelectric layer on the substrate, the method includes: filling the groove with a filling material; forming the first electrode exposing a portion of the filling material on the filling material and the substrate, a material of the first electrode being different from the filling material; and etching at least a portion of the filling material within the groove to form a cavity on a side of the groove close to the first electrode.

For example, the material of the first electrode includes titanium, and the filling material includes molybdenum.

For example, an orthographic projection of the piezoelectric layer formed on the first electrode on the substrate entirely falls within the groove.

For example, forming the second electrode on the piezoelectric layer includes: forming a planarization layer on the piezoelectric layer; forming a via hole in the planarization layer to expose the piezoelectric layer; and forming the second electrode on the planarization layer. The second electrode is connected to the piezoelectric layer through the via hole.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The terms "on," "under," "right," "left" and the like are only used to indicate relative position relationship.

During research, an inventor of the present application has found that, when a general ultrasonic sensor generates mechanical vibration under an excitation of an alternating current signal, a part of the mechanical vibration signal is absorbed, resulting in a loss of the mechanical vibration signal, thereby reducing the sensitivity of the ultrasonic sensor.

Figure 1:
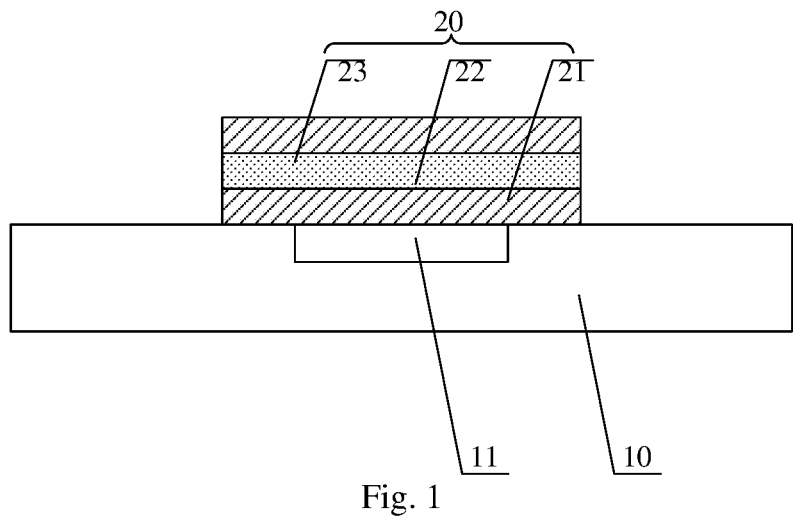
FIG. 1 is a schematic structural diagram of an ultrasonic sensor according to an embodiment of the present disclosure.

FIG. 1 is a schematic structural diagram of an ultrasonic sensor according to at least one embodiment of the present disclosure. As shown in FIG. 1, the ultrasonic sensor provided by the embodiment of the present disclosure includes: a substrate 10 and at least one sensor component 20 located on the substrate 10. The sensor component 20 includes a first electrode 21, a second electrode 23, and a piezoelectric layer 22 between the first electrode 21 and the second electrode 23. A side of the substrate 10 close to the sensor component 20 is provided with a groove 11. An orthographic projection of the piezoelectric layer 22 on the substrate 10 has a portion overlapping with the region of the groove 11 in the substrate 10. That is, the orthographic projection of the piezoelectric layer 22 on the plane of the substrate 10 overlaps with an orthographic projection of the groove 11 on the plane of the substrate 10.

For example, the first electrode 21 is located on a side of the piezoelectric layer 22 close to the substrate 10.

For example, as shown in FIG. 1, the first electrode 21 is in contact with the piezoelectric layer 22 to apply a voltage to the piezoelectric layer 22, and the second electrode 23 is also in contact with the piezoelectric layer 22 to apply a voltage to the piezoelectric layer 22.

For example, the first electrode 21 is in direct contact with the substrate 10.

For example, the sensor component provided in the embodiments of the present disclosure is used for transmitting ultrasonic waves. The working principle of the sensor component includes that high-frequency signals are applied to the first electrode 21 and the second electrode 23, and the piezoelectric layer 22 generates mechanical vibration due to the piezoelectric effect of the piezoelectric layer 22, thereby generating ultrasonic waves.

For example, in order to increase the bending performance of the ultrasonic sensor, the substrate 10 may be a flexible substrate, which may be made of polyimide (PI). The embodiments of the present disclosure are not limited thereto, the substrate provided by the embodiment of the present disclosure may also be made of other materials, and the embodiments of the present disclosure are not limited thereto.

For example, in a case where the substrate 11 is made of polyimide, the material of the substrate 11 also includes silicon oxide in order to block moisture.

For example, the first electrode 21 and the second electrode 23 are made of a conductive material. For example, the conductive material may include metal materials such as platinum, iridium, gold, aluminum, copper, titanium, stainless steel, or the like, or tin oxide-based conductive materials such as indium tin oxide, fluorine-doped tin oxide, or the like. For example, at least one of the first electrode 21 and the second electrode 23 may also be a multi-layer conductive structure including, for example, a first metal layer, a second metal layer, and a third metal layer. The first metal layer may be made of titanium, the second metal layer may be made of aluminum, and the third metal layer may be made of titanium, which is not limited in the embodiment of the present disclosure. For example, the first metal layer is on a side close to the substrate and the second metal layer is between the first metal layer and the third metal layer. The embodiments of the present disclosure are not limited to materials and structures of the first electrode and the second electrode.

For example, the material of the piezoelectric layer 22 may include polydifluoroethylene, aluminum nitride (AlN), or a composite oxide of a perovskite structure of lead zirconate titanate and the like.

In at least one embodiment of the present disclosure, by providing a groove in the substrate, the ultrasonic wave is prevented from being transmitted downward, and the single-direction transmission of the ultrasonic wave is realized. The absorption of the mechanical vibration generated upon the ultrasonic sensor generating the ultrasonic wave can be reduced.

In the embodiment of the present disclosure, the absorption of the mechanical vibration signals generated by the ultrasonic sensor under the excitation of the alternating current signal by the substrate can be reduced, and the quality of the ultrasonic signal can be ensured through providing a groove in the area of the substrate that faces the piezoelectric layer. Thereby, the energy loss caused by the direct contact between the sensor component and the substrate is improved, and the sensitivity of the ultrasonic sensor is increased.

Figure 2:
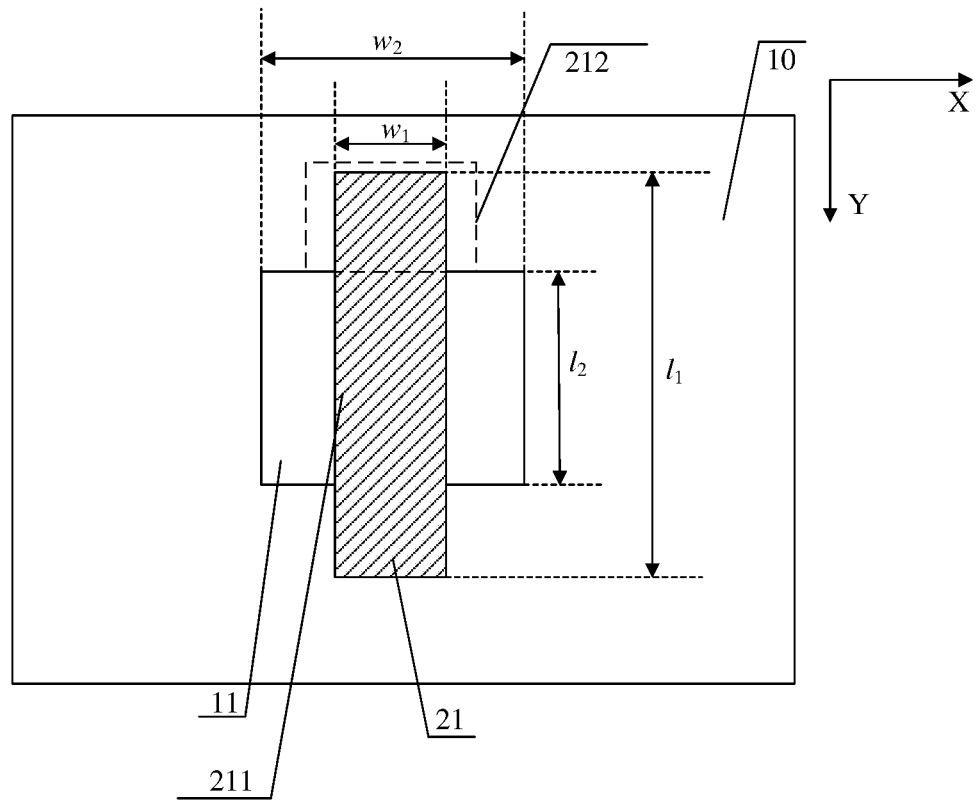
FIG. 2 is a top view of an ultrasonic sensor according to an embodiment of the present disclosure.

For example, FIG. 2 is a top view of an ultrasonic sensor provided by at least one embodiment of the present disclosure. As shown in FIG. 2, the first electrode 21 is located on the side of the piezoelectric layer close to the substrate 10. An orthographic projection of the first electrode 21 on the substrate 10 includes a first portion 211 located within the groove 11 and a second portion 212 located on both sides of the groove 11 in the first direction.

For example, the first electrode 21 exposes a portion of the groove 11.

For example, as shown in FIG. 2, in the first direction, the dimension $l_1$ of the first electrode 21 is larger than the dimension $l_2$ of the groove 11, and in the second direction, the dimension $w_1$ of the first electrode 21 is smaller than the dimension $w_2$ of the groove 11. Here, FIG. 2 is an example in which Y direction is the first direction, and X direction is the second direction.

The embodiments of the present disclosure are not limited thereto. For example, in the first direction, the dimension $l_1$ of the first electrode 21 may also be smaller than the dimension $l_2$ of the groove 11, and in the second direction, the dimension $w_1$ of the first electrode 21 may also be larger than the dimension $w_2$ of the groove 11.

The first direction and the second direction described above are directions parallel to the main plane of the substrate. For example, the first direction is perpendicular to an overlapping direction of the first electrode, the piezoelectric layer, and the second electrode. The second direction is perpendicular to the first direction. The first direction and the second direction in the embodiments of the present disclosure may be interchanged. For example, an X axis can also be the first direction, and a Y axis can also be the second direction. FIG. 2 takes an example that the X-axis is the second direction and the Y-axis is the first direction.

For example, the shapes of the first electrode and the second electrode may be rectangular, or other shapes, and the embodiments of the present disclosure are not limited thereto. It should be noted that FIG. 2 takes an example that the shape of the first electrode is a rectangle.

For example, as shown in FIG. 1 and FIG. 2, the orthographic projection of the piezoelectric layer 22 on the substrate 10 coincides with the orthographic projection of the first electrode 21 on the substrate 10. That is, the orthographic projection of the piezoelectric layer on the substrate also includes a portion located within the groove and a portion located on both sides of the groove in the first direction. The term "overlap" in the embodiments of the present disclosure includes fully coincident and substantially coincident. Substantially coincident may indicate that an area of the portion where the two do not coincide is no more than 10% of an area of the coincident portion.

For example, as shown in FIG. 2, the shape of the groove 11 may be rectangular, which is not limited in the embodiment of the present disclosure. For example, the shape of the groove can also be a circle, or an irregular shape.

For example, as shown in FIG. 1 and FIG. 2, the depth of the groove 11 in the direction perpendicular to the substrate 10 is in a range of 3 to 10 μm. For example, the depth of the groove 11 can be in a range of 5 to 8 μm.

For example, as shown in FIG. 1 and FIG. 2, the dimension 12 of the groove 11 in the first direction may be in a range of 20 to 50 μm, and the dimension $w_2$ of the groove 11 in the second direction may be in a range of 20 to 50 μm. For example, the dimension $l_2$ of the groove 11 in the first direction may be in a range of 30 to 40 μm. For example, the dimension $w_2$ of the groove 11 in the second direction may be in a range of 30 to 40 μm. The dimensions of the groove in the first direction and the second direction may be the same or different. The embodiments of the present disclosure are not limited thereto, as long as the first electrode can expose a portion of the groove, and the first electrode includes both ends that are bridges over the groove.

For example, as shown in FIG. 1 and FIG. 2, the orthographic projection of the second electrode 23 on the substrate 10 coincides with the orthographic projection of the first electrode 21 on the substrate 10. The orthographic projection of the second electrode 23 on the substrate 10 coincides with the orthographic projection of the piezoelectric layer 22 on the substrate 10.

The embodiments of the present disclosure are not limited thereto. For example, the orthographic projection of the first electrode on the substrate may also cover the orthographic projection of the second electrode on the substrate. For example, the orthographic projection of the second electrode on the substrate entirely falls into the orthographic projection of the first electrode on the substrate. The embodiments of the present disclosure are not limited thereto.

For example, to simplify the fabrication process, the orthographic projection of the second electrode 23 on the substrate 10 coincides with the orthographic projection of the first electrode 21 on the substrate 10.

For example, the sensor component provided by the embodiments of the present disclosure can be applied to an ultrasonic sensor that transmits and receives ultrasonic waves on the same side.

Figure 3:
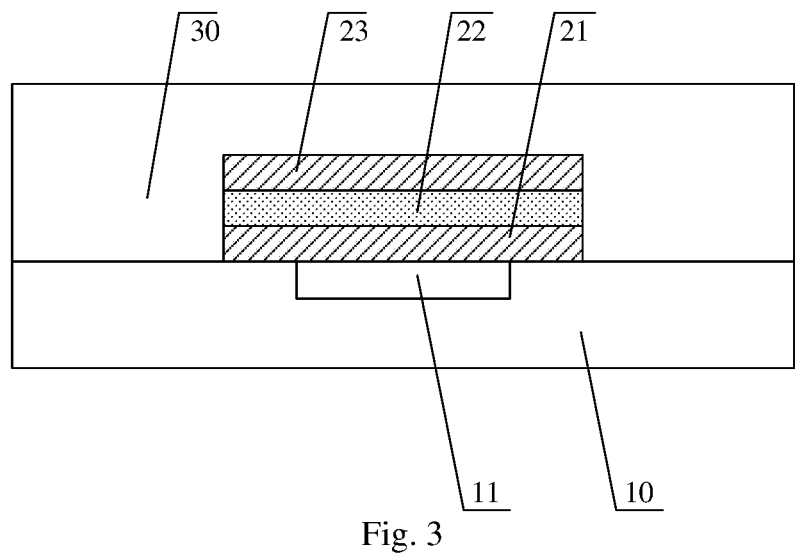
FIG. 3 is a side view of an ultrasonic sensor according to an embodiment of the present disclosure.

For example, FIG. 3 is a side view of an ultrasonic sensor provided by an embodiment of the present disclosure. As shown in FIG. 3, the ultrasonic sensor provided by the embodiment of the present disclosure further includes: a cover plate 30 located on a side of a sensor component away from the substrate 10.

For example, as shown in FIG. 3, the cover plate 30 covers the entire substrate 10, and a material of the cover plate 30 may be a flexible material, such as polyimide, which is not limited in this embodiment of the present disclosure.

In the embodiment of the present disclosure, after the cover plate is disposed on the side of the sensor component away from the substrate, a receiving component of the ultrasonic sensor and/or a detecting circuit and the like may also be disposed on the cover plate.

Figure 4:
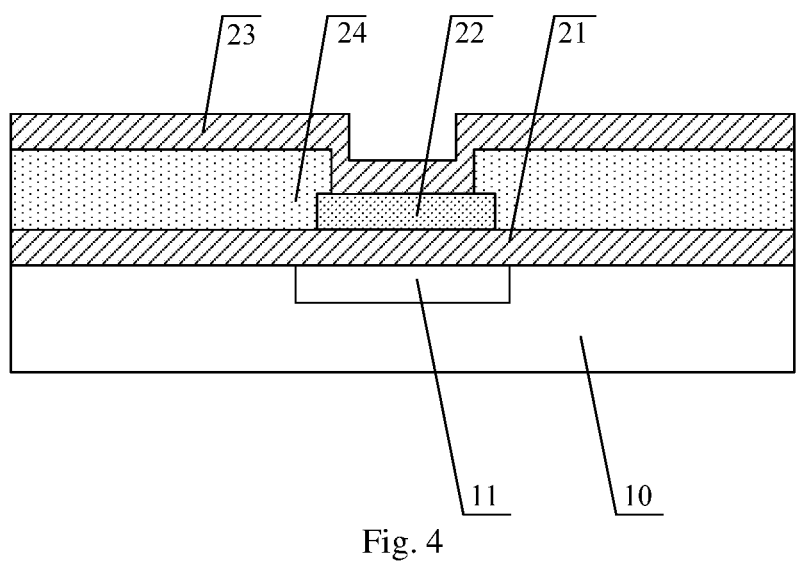
FIG. 4 is a side view of an ultrasonic sensor according to another embodiment of the present disclosure.
Figure 5:
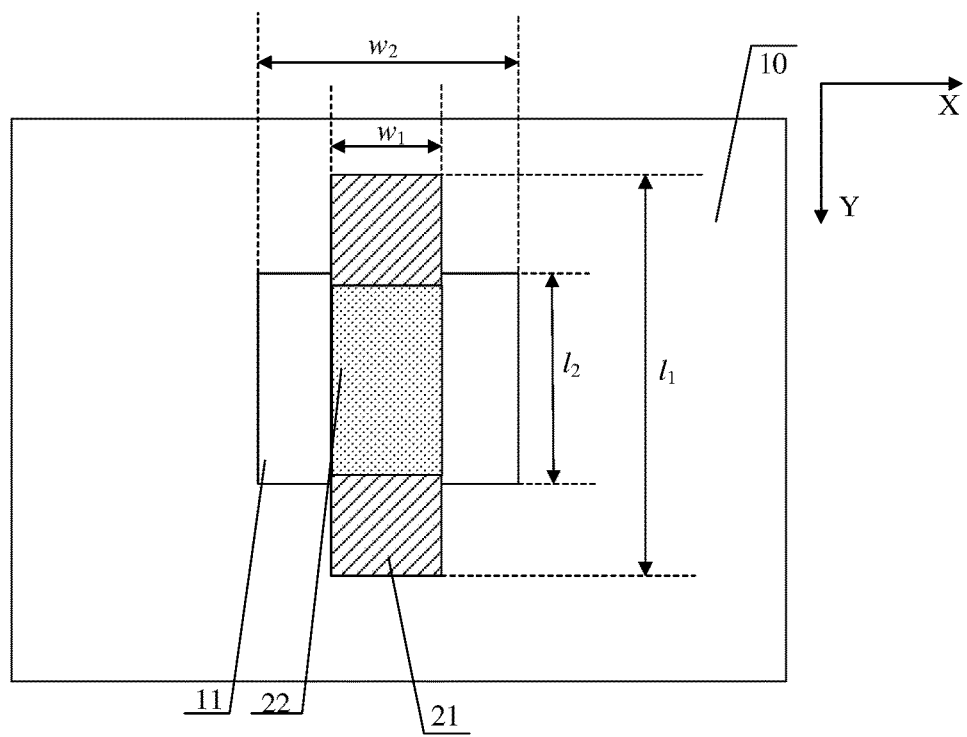
FIG. 5 is a partial top view of the ultrasonic sensor shown in FIG. 4.

For example, FIG. 4 is a side view of an ultrasonic sensor according to another embodiment of the present disclosure, and FIG. 5 is a partial top view of the ultrasonic sensor shown in FIG. 4. As shown in FIG. 4, in the ultrasonic sensor provided by the embodiment of the present disclosure, a region of the groove 11 on the substrate 10 covers the orthographic projection of the piezoelectric layer 22 on the substrate 10. That is, in the present embodiment, the orthographic projection of the piezoelectric layer 22 on the substrate 10 is entirely located within the region of the groove 11 on the substrate 10.

For example, as shown in FIG. 4 and FIG. 5, the dimension of the piezoelectric layer 22 in the first direction is smaller than the dimension of the groove 11 in the first direction, and the dimension of the piezoelectric layer 22 in the second direction is smaller than the dimension of the groove 11 in the second direction. The shape of the first electrode in the embodiment shown in FIG. 5 may be the same as the shape of the first electrode in the embodiment shown in FIG. 2, and the positional relationship between the first electrode and the groove in the embodiment shown in FIG. 5 may be the same as the positional relationship between the first electrode and the groove in the embodiment shown in FIG. 2, the description of which is no longer repeated herein.

For example, the orthographic projection of the piezoelectric layer 22 on the substrate 10 entirely falls within the orthographic projection of the first electrode 21 on the substrate 10. That is, the orthographic projection of the piezoelectric layer 22 on the substrate 10 entirely falls within the region where the first electrode 21 overlaps with the groove 11.

In the embodiment of the present disclosure, the region of the groove on the substrate covers the orthographic projection of the piezoelectric layer on the substrate, which can facilitate the bending of the piezoelectric layer and enhance the bending performance of the ultrasonic sensor, as well as provide a good protection effect on the ultrasonic sensor. In addition, the orthographic projection of the piezoelectric layer on the substrate is entirely within the groove, thereby the influence of the substrate on the mechanical vibration of the piezoelectric layer can be minimized, and the sensitivity of the ultrasonic sensor is improved.

Figure 6:
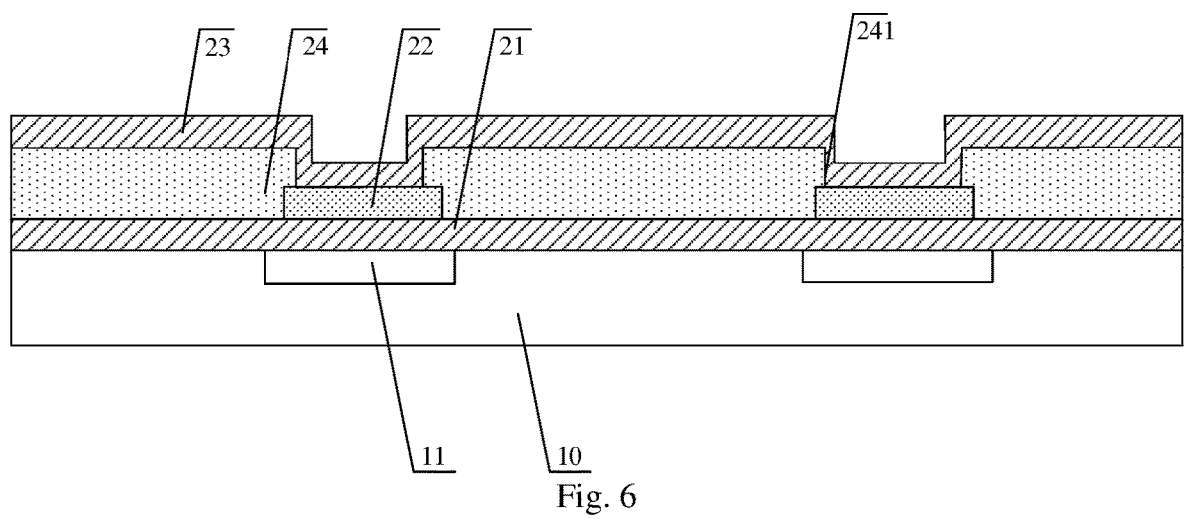
FIG. 6 is a side view of an ultrasonic sensor according to another embodiment of the present disclosure.

For example, FIG. 6 is a side view of an ultrasonic sensor according to another embodiment of the present disclosure. As shown in FIG. 6, the ultrasonic sensor in this embodiment includes a plurality of sensor components. In order to simplify the fabricating process and to realize the synchronized generation of ultrasonic signals by the plurality of sensor components, the plurality of sensor components in the ultrasonic sensor provided by the embodiments of the present disclosure share one first electrode 21 and/or share one second electrode 23. The plurality of sensor components shown schematically in FIG. 6 share both the one first electrode 21 and the one second electrode 23. However, it is not limited thereto, and the plurality of sensor components may share only one first electrode, or the plurality of sensor components may share only one second electrode.

For example, as shown in FIG. 6, the ultrasonic sensor provided by the embodiment of the present disclosure further includes: a planarization layer 24 located on a side of the piezoelectric layer 22 away from the substrate 10. The planarization layer 24 includes a via hole 241 exposing the piezoelectric layer 22, and the second electrode 23 is connected to the piezoelectric layer 22 through the via hole 241. That is, the second electrode 23 is in contact with the piezoelectric layer 22 through the via hole 241 to supply a voltage to the piezoelectric layer 22.

For example, the planarization layer 24 provided in the embodiment of the present disclosure can ensure that the plurality of sensor components can share one second electrode 23.

For example, in a case that the first electrode is an electrode shared by the plurality of sensor components, the planarization layer is located between the first electrode and the second electrode so as to insulate the two electrodes.

For example, in a case that the plurality of sensor components share only one second electrode, the planarization layer may be provided only at a position where the second electrode is directly opposite the first electrode so as to insulate the two electrodes.

For example, the planarization layer 24 may be made of polyimide, or silicon oxide, silicon nitride or a composite of silicon oxide and silicon nitride. The embodiments of the present disclosure are not limited thereto, as long as the material of the planarization layer in the embodiment of the present disclosure is an insulating material.

For example, in order to enhance the bending performance of the ultrasonic sensor, the planarization layer is made of a flexible material such as polyimide.

Figure 7:
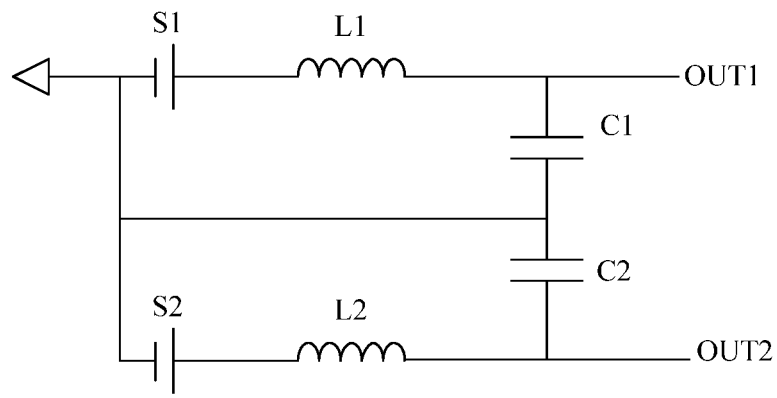
FIG. 7 is a high-frequency signal generating circuit according to an embodiment of the present disclosure.

For example, FIG. 7 is a high-frequency signal generating circuit provided by an embodiment of the present disclosure. As shown in FIG. 7, the circuit diagram provided by the embodiment of the present disclosure includes: a first power source S1, a second power source S2, a first inductor L1, a second inductor L2, a first capacitor C1, and a second capacitor C2. A negative pole of the first power source S1 is grounded, and its positive pole is connected to a first end of the first inductor L1. A negative pole of the second power source S2 is grounded, and its positive pole is connected to a first end of the second inductor L2. A second end of the first inductor L1 is connected to a first end of the first capacitor C1, and a second end of the second inductor L2 is connected to a second end of the second capacitor C2. A second end of the first capacitor C1 is respectively connected to a first end of the second capacitor C2 and the negative pole of the first power source S1, the first end of the first capacitor C1 is connected to a first output end OUT1, and the second end of the second capacitor C2 is connected to a second output end OUT2.

For example, the first output end OUT1 is connected to the first electrode, and the second output end OUT2 is connected to the second electrode.

For example, the circuit provided in FIG. 7 can generate high-frequency electrical signals, and the high-frequency electrical signals corresponding to the first output end OUT1 and the second output end OUT2 have a phase difference of 180°.

Figure 8:
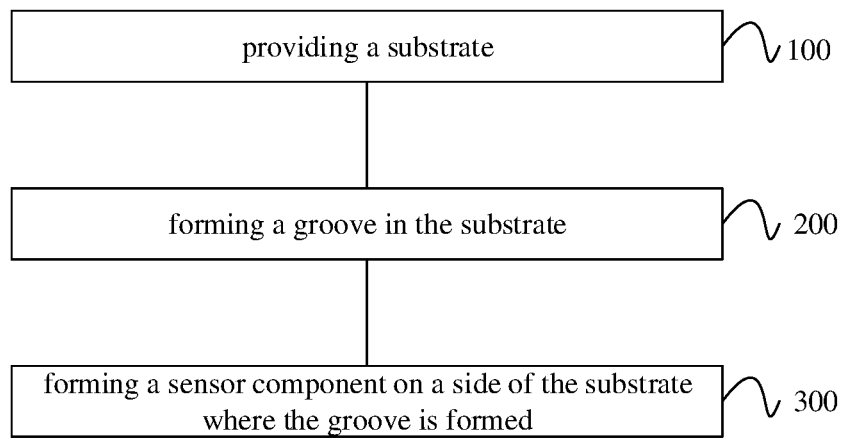
FIG. 8 is a flowchart of a manufacturing method of an ultrasonic sensor according to another embodiment of the present disclosure.

For example, FIG. 8 is a flowchart of a manufacturing method of an ultrasonic sensor according to another embodiment of the present disclosure. As shown in FIG. 8, the manufacturing method of the ultrasonic sensor provided by the embodiment of the present disclosure specifically includes the following steps:

Step 100: providing a substrate.

For example, in order to increase the bending performance of the ultrasonic sensor, the substrate is a flexible substrate, and the material of which may be a flexible material such as polyimide (PI). The substrate provided by the embodiment of the present disclosure may also be made of other materials, and the embodiments of the present disclosure are not limited thereto.

For example, in a case where the substrate is made of polyimide, the substrate may further include silicon oxide so as to block moisture.

Step 200: forming a groove in the substrate.

For example, a groove is formed in the substrate by an etching process. For example, the etching process may include a dry etching process, which is not limited by the embodiment of the present disclosure. The groove may also be formed by laser drilling.

For example, as shown in FIG. 1 and FIG. 2, the depth of the groove 11 in the direction perpendicular to the substrate 10 is in a range of 3 to 10 μm. For example, the depth of the groove 11 can be in a range of 5 to 8 μm.

For example, as shown in FIG. 1 and FIG. 2, the dimension of the groove in the first direction may be in the range of 20 to 50 μm, and the dimension of the groove in the second direction may be in the range of 20 to 50 μm. For example, the dimension $l_2$ of the groove 11 in the first direction may be in the range of 30 to 40 μm. For example, the dimension $w_2$ of the groove 11 in the second direction may be in the range of 30 to 40 μm. The dimensions of the groove in the first direction and the second direction may be the same or different. The embodiments of the present disclosure are not limited thereto, as long as the first electrode can expose a portion of the groove, and the first electrode includes two ends that are bridges over the groove.

Step 300: forming a sensor component on a side of the substrate where the groove is formed.

The sensor component includes a first electrode, a second electrode, and a piezoelectric layer located between the first electrode and the second electrode. The orthographic projection of the piezoelectric layer on the substrate has a portion overlapping with the region of the groove in the substrate.

For example, a step of forming the sensor component includes sequentially forming the first electrode, the piezoelectric layer, and the second electrode on the substrate which are laminated.

For example, in an example of an embodiment of the present disclosure, in the formed sensor component, the orthographic projection of the first electrode on the substrate, the orthographic projection of the piezoelectric layer on the substrate, and the orthographic projection of the second electrode on the substrate all coincide, so as to form the sensor component as shown in FIG. 1.

For example, as long as the materials of the first electrode and the second electrode are conductive materials. For example, the materials of the first electrode and the second electrode may include metal materials such as platinum, iridium, gold, aluminum, copper, titanium, stainless steel, or the like, or tin oxide-based conductive materials such as indium tin oxide, fluorine-doped tin oxide, or the like. For example, the materials of the first electrode and the second electrode may also be a multi-layer conductive structure, for example, including: a first metal layer, a second metal layer, and a third metal layer. For example, the first metal layer may be made of titanium, the second metal layer may be made of aluminum, and the third metal layer may be made of titanium. The first metal layer is on a side close to the substrate, and the second metal layer is located between the first metal layer and the third metal layer. The materials and structures of the first electrode and the second electrode are not limited in the embodiments of the present disclosure.

For example, the piezoelectric layer may include polydifluoroethylene, aluminum nitride (AlN), or a composite oxide of a perovskite structure of lead zirconate titanate and the like, as long as it can have a piezoelectric effect.

In the embodiment of the present disclosure, the absorption of the mechanical vibration signals generated by the ultrasonic sensor under the excitation of the alternating current signal by the substrate can be reduced, and the quality of the ultrasonic signal can be ensured through providing a groove in the area in the substrate that faces the piezoelectric layer. Thereby, the sensitivity of the ultrasonic sensor is increased.

For example, before forming the piezoelectric layer on the substrate, the manufacturing method further includes: filling the groove formed in the substrate with a filling material; forming a first electrode on the substrate, that is, forming the first electrode on the filling material that exposes a portion of the filling material; and etching at least a portion of the filling material within the groove by an etch process to form a cavity on a side of the groove close to the first electrode.

For example, a surface of the filling material formed is flush with a surface of the substrate, so that the surface of the first electrode formed on the filling material and the substrate facing the substrate is substantially planar.

For example, the first electrode is located on a side of the piezoelectric layer close to the substrate. The orthographic projection of the first electrode on the substrate includes a first portion located within the groove and a second portion located on both sides of the filling material in the first direction.

For example, the first electrode exposes a portion of the filling material. In an example of an embodiment of the present disclosure, the filling material is etched after the first electrode is formed, so that the first electrode formed must expose a portion of the filling material to reserve enough space for subsequent etching of the filling material.

For example, the filling material can be molybdenum.

For example, in order to ensure that a cavity is formed by etching in the groove of the substrate, it is necessary to ensure that the filling material is different from the material of the first electrode. For example, the etching process for etching the filling material is a wet etching process, and the etching speed of the etching liquid to etch the filling material is faster than the etching speed of the etching liquid to etch the first electrode. It is intended not to etch the first electrode while etching the filling material. The etching selection ratio of the first electrode and the filling material can be selected according to actual process, such as 1:200, or 1:50, etc., as long as the filling material is etched while the first electrode is not affected.

For example, in the process of etching the filling material, the filling material may be entirely etched away, or only a portion of the filling material may be etched, as long as the side of the groove that faces the first electrode can form a cavity.

For example, a step of forming the first electrode on the substrate may include: depositing a conductive material on the substrate by a process of vacuum sputtering, evaporation, or coating and the like, and forming the first electrode by a patterning process.

It should be noted that the patterning process includes: photoresist coating, exposure, development, etching or stripping of photoresist and the like.

For example, a step of forming the piezoelectric layer on the first electrode may include: depositing a piezoelectric material on the substrate by a process of vacuum sputtering, evaporation, or coating and the like, and forming the piezoelectric layer by a patterning process.

For example, a step of forming the second electrode on the piezoelectric layer may include: depositing a conductive material on the piezoelectric layer by a process of vacuum sputtering, evaporation, or coating and the like, and forming the second electrode by a patterning process.

For example, in another example of an embodiment of the present disclosure, as shown in FIG. 6, the ultrasonic sensor includes a plurality of sensor components. The plurality of sensor components in the ultrasonic sensor share one first electrode and/or share one second electrode, in order to simplify the fabricating process and to realize the synchronized generation of ultrasonic signals by the plurality of sensor components. FIG. 6 schematically shows that the plurality of sensor components share both the one first electrode 21 and the one second electrode 23. However, it is not limited thereto, and the plurality of sensor components may share only one first electrode, or the plurality of sensor components may share only one second electrode.

A step of forming the second electrode 23 on the piezoelectric layer 22 provided by the embodiment of the present disclosure includes: forming a planarization layer 24 on the piezoelectric layer 22 and forming the second electrode 23 on the planarization layer 24.

For example, the process of forming the planarization layer 24 includes patterning the planarization layer 24 to form the via hole 241 to expose the piezoelectric layer 22, and the second electrode 23 is connected to the piezoelectric layer 22 through the via hole 241 in the planarization layer 24 to supply voltage to the piezoelectric layer 22.

For example, the fabricating material of the planarization layer 24 may be polyimide, or may be silicon oxide, silicon nitride or a composite of silicon oxide and silicon nitride, which is not limited in the embodiment of the present disclosure.

For example, in order to enhance the bending performance of the ultrasonic sensor, the material of the planarization layer may use flexible materials such as polyimide.

Figure 9A:
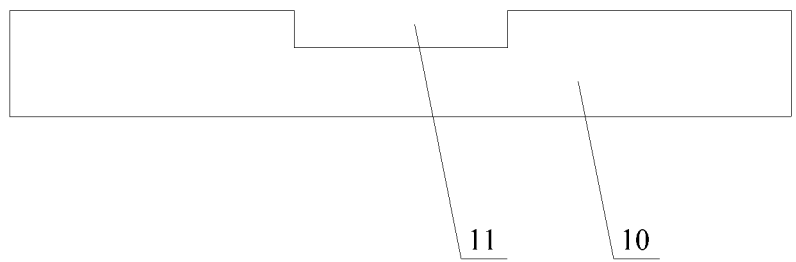
FIGS. 9A-9C are schematic diagrams showing a partial process flow of a manufacturing method of an ultrasonic sensor according to an embodiment of the present disclosure.
Figure 9B:
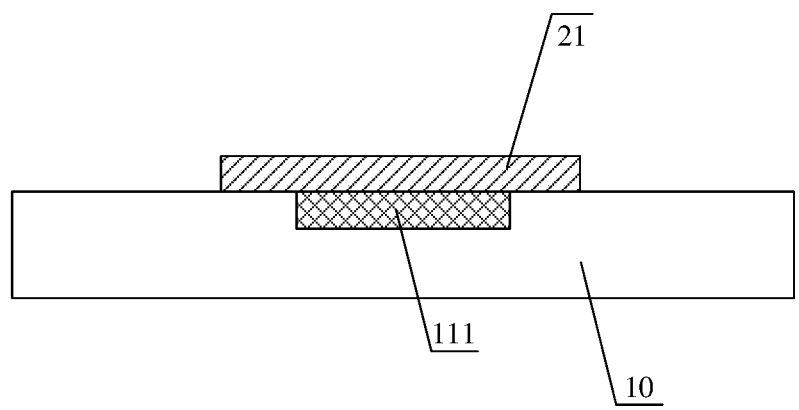
Figure 9C:
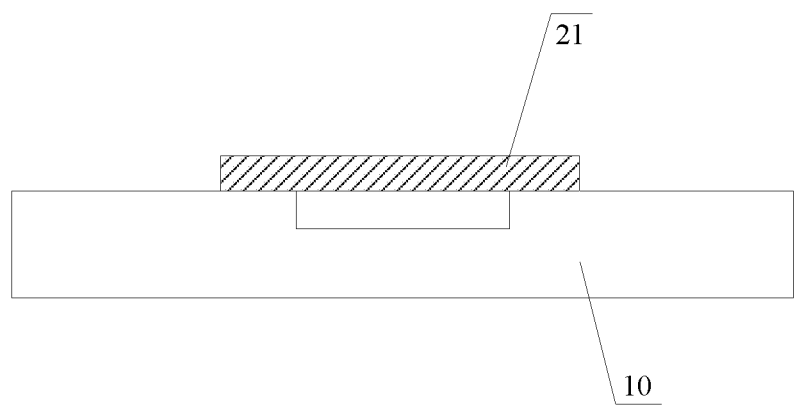

For example, FIG. 9A-FIG. 9C are flow diagrams of a method of forming a portion of an ultrasonic sensor provided by an embodiment of the present disclosure.

Step 401: as shown in FIG. 9A, a substrate 10 is provided, and a groove 11 is formed in the substrate 10 by an etching process.

For example, the substrate 10 is a flexible substrate, which may be made of polyimide (PI).

Step 402: as shown in FIG. 9B, the groove 11 formed in the substrate 10 is filled with the filling material 111, and a first electrode 21 is formed on the substrate 10. For example, a gap is included between an edge of the orthographic projection of the first electrode on the substrate and an edge of the orthographic projection of the filling material on the substrate, which is also a gap between the first electrode and the groove for exposing the filling material.

For example, the filling material 111 may be deposited on the substrate 10 by a process of vacuum sputtering, evaporation, or coating and the like.

For example, the filling material 111 may be molybdenum, which is different from the material of the first electrode.

Step 403: as shown in FIG. 9C, the filling material 111 in the groove 11 is etched by an etching process.

For example, a wet etching process is adopted to flow the etching liquid through the gap between the first electrode and the groove to etch away the filling material. Because the filling material and the material of the first electrode are different, in a case where they are etched with the same etching liquid, the etching selection ratio of the two are relatively large. Therefore, the first electrode is not etched.

Step 404: as shown in FIG. 1, a piezoelectric layer 22 is formed on the first electrode 21, and a second electrode 23 is formed on the piezoelectric layer 22.

For example, a piezoelectric material may be deposited on the substrate 10 by a process of vacuum sputtering, evaporation, or coating and the like, and the piezoelectric layer 22 may be formed by a patterning process. A conductive material is deposited on the piezoelectric layer 22 by a process of vacuum sputtering, evaporation, or coating and the like, and the second electrode 23 is formed by a patterning process.

Step 405: as shown in FIG. 3, a cover plate 30 is formed on the second electrode 23.

For example, a flexible material may be deposited on the second electrode 23 by a process of vacuum sputtering, evaporation, or coating and the like, and the cover plate 30 may be formed by a patterning process.

For example, in another example of the embodiment of the present disclosure, the groove 11 is formed in the substrate 10 through steps 401 to 403, and after the first electrode 21 is formed on the substrate 10, the method further includes: forming a piezoelectric layer 22 on the first electrode 21; depositing a flat material on the piezoelectric layer 22, and forming a planarization layer 24 by a patterning process; and forming a second electrode 23 on the planarization layer 24. The second electrode 23 is connected to the piezoelectric layer 22 through a via hole 241 in the planarization layer 24. The ultrasonic sensor formed is as shown in FIG. 4.

In addition, it should be noted that the embodiment of the present disclosure may also fabricate an ultrasonic sensor by providing a substrate, forming a groove in the substrate, and then attaching the sensor components on the substrate.

For example, the sensor component can be formed on other substrates and then transferred to the substrate in the present application.

An embodiment of the present disclosure further provides a display device including the ultrasonic sensor provided by any of the above embodiments.

For example, the ultrasonic sensor provided by the embodiment of the present disclosure can be used for both touch control and fingerprint recognition. The ultrasonic sensor in the display device provided by the embodiment of the present disclosure has higher sensitivity, which facilitates the display device to realize touch control and/or fingerprint recognition while displaying.

For example, the display device may be any product or component having a display function, such as a mobile phone, a tablet computer, a television, a display, a notebook computer, a digital photo frame, a navigator, etc., which is not limited in this embodiment.

The accompanying drawings involve only the structure(s) in connection with the embodiment(s) of the present disclosure, and other structure(s) can be referred to common design(s).

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

The above description is only an exemplary embodiment of the present disclosure, and is not intended to limit the scope of the disclosure. The scope of the disclosure is determined by the appended claims.

What is claimed is:

1. An ultrasonic sensor, comprising: a substrate and at least one sensor component located on the substrate, the at least one sensor component comprising: a first electrode, a second electrode, and a piezoelectric layer located between the first electrode and the second electrode, wherein a side of the substrate close to the sensor component is provided with a groove, and an orthographic projection of the piezoelectric layer on the substrate has a portion overlapping with a region of the groove in the substrate;

the first electrode is located on a side of the piezoelectric layer close to the substrate, and in a first direction parallel to the substrate, an orthographic projection of the first electrode on the substrate includes a first portion located within the groove and a second portion located on both sides of the groove;

the first electrode exposes a portion of the groove, and the portion of the groove does not overlap with the orthographic projection of the first electrode on the substrate.

2. The ultrasonic sensor according to claim 1, wherein a dimension of the first electrode in a second direction is smaller than a dimension of the groove in the second direction, the first direction and the second direction are directions parallel to a main plane of the substrate, and both the first direction and the second direction are perpendicular to an overlapping direction of the first electrode, the piezoelectric layer and the second electrode, and the second direction is perpendicular to the first direction.

3. The ultrasonic sensor according to claim 2, wherein the dimension of the groove in the first direction is in a range of 20 to 50 μm, and the dimension of the groove in the second direction is in a range of 20 to 50 μm.

4. The ultrasonic sensor according to claim 1, wherein the orthographic projection of the piezoelectric layer on the substrate coincides with the orthographic projection of the first electrode on the substrate.

5. The ultrasonic sensor according to claim 1, wherein the orthographic projection of the piezoelectric layer on the substrate is entirely located within the region of the groove on the substrate.

6. The ultrasonic sensor according to claim 5, wherein the at least one sensor component comprises a plurality of sensor components, and the plurality of sensor components share at least one of the first electrode and the second electrode;

the ultrasonic sensor further comprises: a planarization layer located on a side of the piezoelectric layer away from the substrate, wherein the planarization layer comprises a via hole exposing the piezoelectric layer, and the second electrode is connected to the piezoelectric layer through the via hole.

7. The ultrasonic sensor according to claim 1, wherein a depth of the groove in a direction perpendicular to the substrate is in a range of 3 to 10 μm.

8. A display device, comprising the ultrasonic sensor according to claim 1.

9. The display device according to claim 8, wherein the orthographic projection of the piezoelectric layer on the substrate is entirely located within the region of the groove on the substrate.

10. The ultrasonic sensor according to claim 1, wherein the substrate is a flexible substrate.

11. The ultrasonic sensor according to claim 1, wherein an orthographic projection of the second electrode on the substrate coincides with the orthographic projection of the first electrode on the substrate.

12. A manufacturing method of an ultrasonic sensor, comprising:

providing a substrate;

forming a groove in the substrate; and forming a sensor component on a side of the substrate where the groove is formed, wherein forming the sensor component comprises: sequentially forming a first electrode, a piezoelectric layer, and a second electrode on the substrate in a stacked manner, and an orthographic projection of the piezoelectric layer on the substrate has a portion overlapping with a region of the groove in the substrate;

before forming the piezoelectric layer on the substrate, the method comprises:

filling the groove with a filling material;

forming the first electrode exposing a portion of the filling material on the filling material and the substrate, wherein a material of the first electrode is different from the filling material; and etching at least a portion of the filling material within the groove to form a cavity on a side of the groove close to the first electrode.

13. The method according to claim 12, wherein the material of the first electrode comprises titanium, and the filling material comprises molybdenum.

14. The method according to claim 12, wherein the orthographic projection of the piezoelectric layer formed on the first electrode on the substrate entirely falls within the groove.

15. The method according to claim 14, wherein forming the second electrode on the piezoelectric layer comprises:

forming a planarization layer on the piezoelectric layer;

forming a via hole in the planarization layer to expose the piezoelectric layer;

forming the second electrode on the planarization layer, wherein the second electrode is connected to the piezoelectric layer through the via hole.

16. An ultrasonic sensor, comprising: a substrate and at least one sensor component located on the substrate, the at least one sensor component comprising: a first electrode, a second electrode, and a piezoelectric layer located between the first electrode and the second electrode, wherein a side of the substrate close to the sensor component is provided with a groove, and an orthographic projection of the piezoelectric layer on the substrate has a portion overlapping with a region of the groove in the substrate;

the first electrode is located on a side of the piezoelectric layer close to the substrate, and in a first direction parallel to the substrate, an orthographic projection of the first electrode on the substrate includes a first portion located within the groove and a second portion located on both sides of the groove;

the orthographic projection of the piezoelectric layer on the substrate is entirely located within the region of the groove on the substrate;

the at least one sensor component comprises a plurality of sensor components, and the plurality of sensor components share at least one of the first electrode and the second electrode;

the ultrasonic sensor further comprises: a planarization layer located on a side of the piezoelectric layer away from the substrate, wherein the planarization layer comprises a via hole exposing the piezoelectric layer, and the second electrode is connected to the piezoelectric layer through the via hole.

* * * * *